(12) United States Patent
Beasor et al.

(10) Patent No.: US 10,832,839 B1
(45) Date of Patent: Nov. 10, 2020

(54) METAL RESISTORS WITH A NON-PLANAR CONFIGURATION

(71) Applicant: GLOBALFOUNDRIES Inc., Grand Cayman (KY)

(72) Inventors: Scott Beasor, Greenwich, NY (US); Haiting Wang, Clifton Park, NY (US); Sipeng Gu, Clifton Park, NY (US); Jiehui Shu, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/570,575

(22) Filed: Sep. 13, 2019

(51) Int. Cl.
*H01C 7/22* (2006.01)
*H01C 1/012* (2006.01)
*H01C 17/00* (2006.01)
*H01L 23/522* (2006.01)
*H01L 49/02* (2006.01)

(52) U.S. Cl.
CPC .............. *H01C 7/22* (2013.01); *H01C 1/012* (2013.01); *H01C 17/00* (2013.01); *H01L 23/5228* (2013.01); *H01L 28/20* (2013.01)

(58) Field of Classification Search
CPC .......... H01C 7/22; H01C 1/012; H01C 17/00; H01L 23/5228; H01L 28/20
See application file for complete search history.

(56) References Cited

U.S. PATENT DOCUMENTS

| | | | | |
|---|---|---|---|---|
| 5,352,923 A * | 10/1994 | Boyd | | H01L 28/20 257/379 |
| 6,114,251 A * | 9/2000 | Nguyen | | H01L 21/76224 257/E21.252 |
| 6,602,782 B2 * | 8/2003 | Lee | | H01L 21/28556 257/751 |
| 7,084,483 B2 * | 8/2006 | Aitken | | H01L 27/101 257/529 |
| 7,560,761 B2 * | 7/2009 | Cheng | | H01L 27/0682 257/301 |
| 8,334,572 B2 | 12/2012 | Chung et al. | | |
| 9,876,010 B1 | 1/2018 | Zang et al. | | |
| 2004/0000685 A1 * | 1/2004 | Brown | | H01L 27/10861 257/305 |
| 2009/0231087 A1 * | 9/2009 | Hakey | | H01C 3/12 338/311 |
| 2013/0093024 A1 | 4/2013 | Eshun | | |
| 2018/0012791 A1 * | 1/2018 | Sun | | H01L 23/53295 |
| 2018/0058943 A1 * | 3/2018 | Ge | | H01L 28/24 |
| 2018/0211952 A1 * | 7/2018 | Shin | | H01L 27/0629 |
| 2019/0259668 A1 * | 8/2019 | Park | | H01L 21/823456 |
| 2020/0135545 A1 * | 4/2020 | Srivastava | | H01L 21/0228 |

* cited by examiner

Primary Examiner — Kyung S Lee
(74) Attorney, Agent, or Firm — Thompson Hine LLP; Anthony Canale

(57) ABSTRACT

Device structures and fabrication methods for an on-chip resistor. A dielectric layer includes a trench with a bottom and a sidewall arranged to surround the bottom. A metal layer is disposed on the dielectric layer at the sidewall of the trench. The metal layer includes a surface that terminates the metal layer at the bottom of the trench to define a discontinuity that extends along a length of the trench.

20 Claims, 5 Drawing Sheets

METAL RESISTORS WITH A NON-PLANAR CONFIGURATION

BACKGROUND

The invention relates generally to semiconductor device and integrated circuit fabrication and, in particular, to device structures and fabrication methods for an on-chip resistor.

On-chip resistors are passive devices found in many integrated circuits. An on-chip resistor may be formed by depositing a layer of resistor material having a given thickness and patterning the resistor material layer to provide a rectangular resistor body that is dimensioned to a particular length and width. The resistance of an on-chip resistor is based on a combination of physical properties (i.e., cross-sectional area and length of the rectangular shape) and material properties (e.g., resistivity). However, because of dimensional restrictions, permissible reductions in the length and width of the rectangular resistor body are limited.

A dielectric layer is formed over the resistor body and polished to eliminate topography arising from the covered resistor body. A metallization level of an interconnect structure is formed over the polished dielectric layer. One or more interconnect wires may be located in the metallization level directly over the resistor body. As the thickness of the dielectric layer decreases, the risk of shorting between the resistor body and the one or more interconnect wires increases. The risk of shorting cannot be easily avoided due to the absence of a process margin.

Improved device structures and fabrication methods for an on-chip resistor are needed.

SUMMARY

In an embodiment of the invention, a structure for a resistor is provided. The structure includes a dielectric layer having a trench with a bottom and a sidewall arranged to surround the bottom. A metal layer is disposed on the dielectric layer at the sidewall of the trench. The metal layer includes a surface that terminates the metal layer at the bottom of the trench to define a discontinuity that extends along a length of the trench.

In an embodiment of the invention, a method of forming a structure for a resistor is provided. The method includes depositing a dielectric layer, patterning a trench in the dielectric layer, conformally depositing a metal layer on the dielectric layer at a sidewall of the trench and at a bottom of the trench, and removing the metal layer from the bottom of the trench to define a surface that terminates the metal layer to define a discontinuity that extends along a length of the trench.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
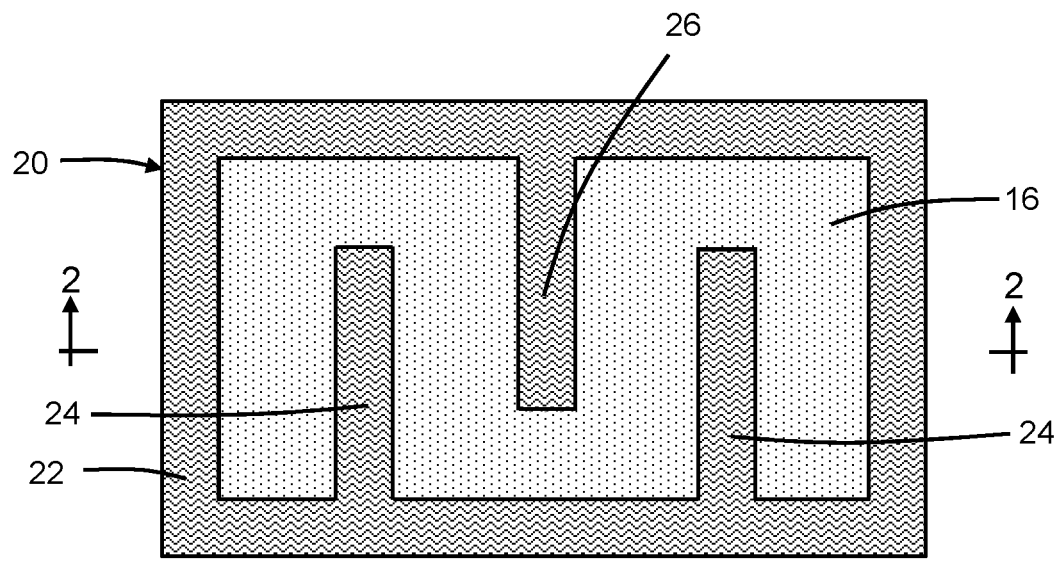
FIG. 1 is a top view of a structure at an initial fabrication stage of a processing method in accordance with embodiments of the invention.
Figure 2:
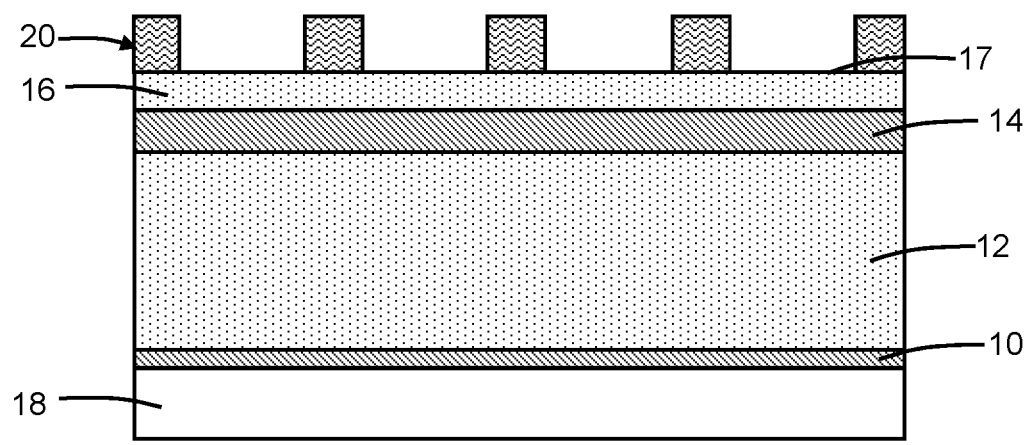
FIG. 2 is a cross-sectional view taken generally along line 2-2 in FIG. 1.

With reference to FIGS. 1, 2 and in accordance with embodiments of the invention, dielectric layers 10, 12, 14, 16 are arranged in a layer stack over a substrate 18. The substrate 18 may be, for example, a bulk substrate composed of a single-crystal semiconductor material, such as a bulk single-crystal silicon substrate. The dielectric layer 10, which is directly over the substrate 18, may be composed of silicon nitride, and may be a section of a contact etch stop layer. The dielectric layer 12, which is directly over the dielectric layer 10, may be composed of silicon dioxide. The dielectric layer 14, which is directly over the dielectric layer 12, may be composed of SiCN. The dielectric layer 16, which is directly over the dielectric layer 14, may be composed of silicon dioxide deposited by chemical vapor deposition using ozone and tetraethylorthosilicate (TEOS) as reactants.

An etch mask 20 is formed over a top surface 17 of the dielectric layer 16. The etch mask 20 may include a layer of a light-sensitive material, such as an organic photoresist, applied by a spin coating process, pre-baked, exposed to light projected through a photomask, baked after exposure, and developed with a chemical developer. The etch mask 20 includes a frame 22 and ribs 24, 26 that project inwardly into the space surrounded by the frame 22. The ribs 24 project inwardly from one side of the frame 22, and the rib 26 projects inwardly from an opposite side of the frame 22. The ribs 24, 26 have a length that is shorter than a length of interior area surrounded by the frame 22 such that the terminating ends of the ribs 24, 26 are spaced from the frame 22 to provide respective gaps.

Figure 3:
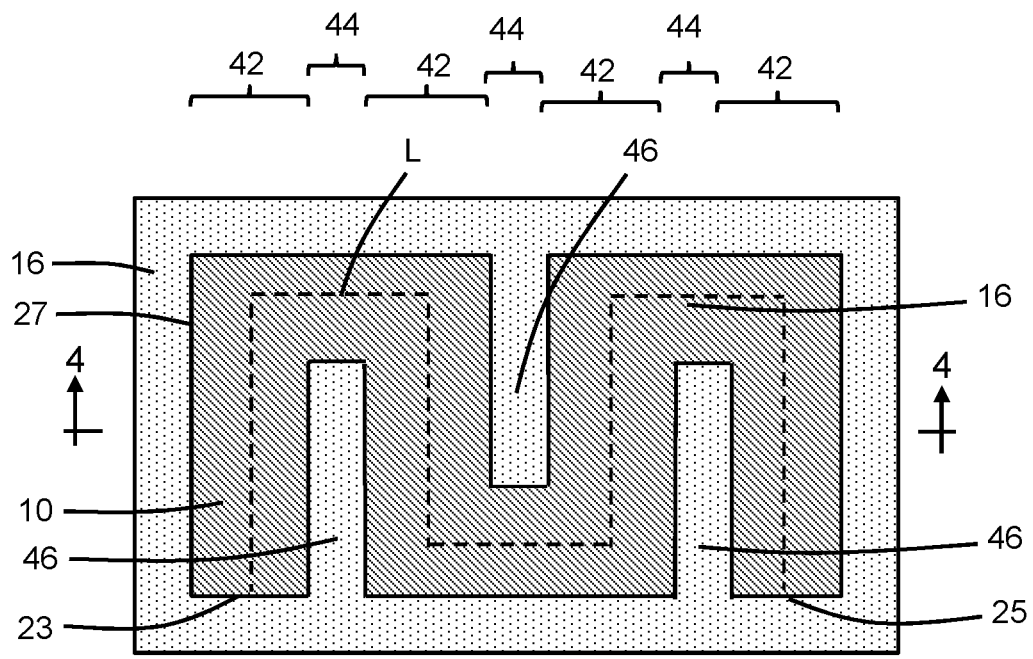
FIG. 3 is a top view of the structure at a fabrication stage subsequent to FIG. 1.
Figure 4:
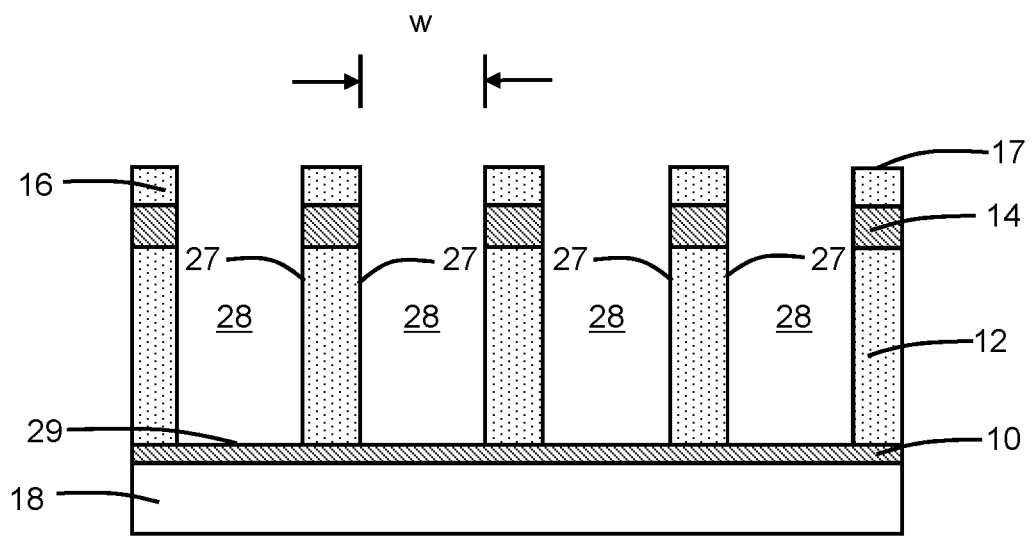
FIG. 4 is a cross-sectional view taken generally along line 4-4 in FIG. 3.

With reference to FIGS. 3, 4 in which like reference numerals refer to like features in FIGS. 1, 2 and at a subsequent fabrication stage, a trench 28 is etched in the dielectric layers 12, 14, 16 using an etching process, such as a reactive ion etching process, with the etch mask 20 present. Portions of the dielectric layers 12, 14, 16 that are not covered by frame 22 and ribs 24, 26 of the etch mask 20 are removed by the etching process. The dielectric layer 10 may function as an etch stop establishing a uniform trench depth equal to the thickness of the dielectric layers 12, 14, 16. The etch mask 20 may be stripped following formation of the trench 28 by, for example, plasma ashing.

The trench 28 winds back and forth along a length, L, with a meandering or serpentine pattern that is the complement of the pattern provided by the etch mask 20. The trench 28 includes sections 42 with a parallel or substantially parallel arrangement and transverse sections 44 providing the changes in direction of the meandering or serpentine pattern. The different sections 42 of the trench 28 are separated by fingers 46 of the dielectric layers 12, 14, 16. Each of the fingers 46 is surrounded on three sides by a pair of the sections 42 and one of the transverse sections 44. The length, L, of the trench 28 reflects the changes in direction provided by the different sections 42, 44. The trench 28 terminates at opposite ends 23, 25 between which the length, L, of the trench 28 is measured.

The trench 28 has a sidewall 27 that extends through the dielectric layers 12, 14, 16 to terminate at the dielectric layer 10. The sidewall 27 is continuous with and surrounds a bottom 29 of the trench 28 over which a portion of the dielectric layer 10 is exposed. The sidewall 27 of the trench 28 intersects the top surface 17 of the dielectric layer 16 at an edge that extends about the winding perimeter of the trench 28. The sidewall 27 and bottom 29 of the trench 28 also intersect at a corner that extends about the winding perimeter of the trench 28. The trench 28 has a width, w, that may be uniform about the length, L, of the trench 28.

Figure 5:
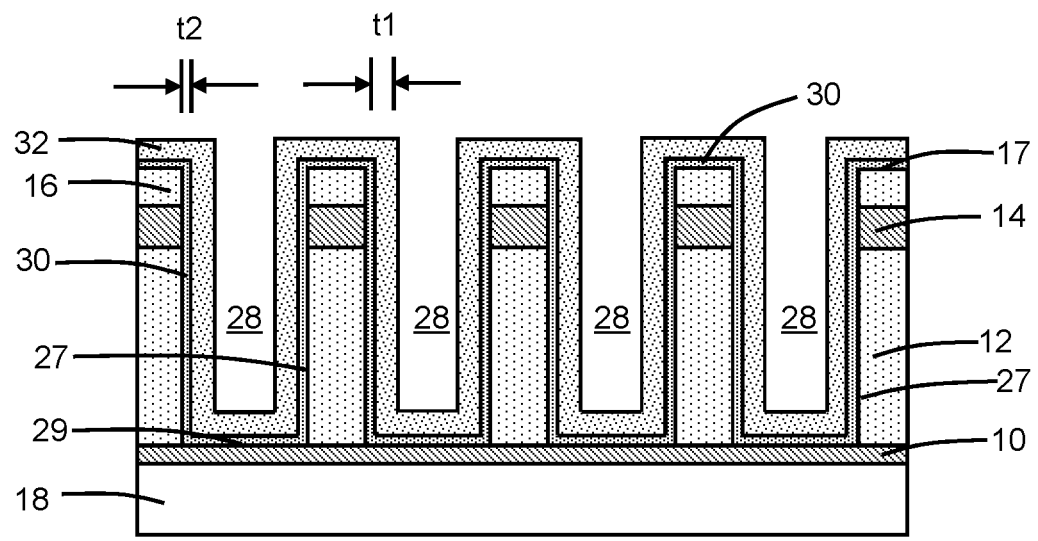
FIGS. 5 and 6 are cross-sectional views of the structure at successive fabrication stages subsequent to FIG. 4.

With reference to FIG. 5 in which like reference numerals refer to like features in FIG. 4 and at a subsequent fabrication stage, a dielectric layer 30 and a metal layer 32 are formed on the dielectric layers 12, 14, 16 bordering the sidewall 27 of the trench 28 and on the dielectric layer 10 bordering the bottom 29 of the trench 28. The layers 30, 32 are also formed on the top surface 17 of the dielectric layer 16 surrounding the trench 28. The metal layer 32 may be composed of a metal, such as titanium nitride or tungsten silicide, that is conformally deposited with a uniform thickness by atomic layer deposition. The dielectric layer 30, which is arranged between the metal layer 32 and the surfaces of the dielectric layers 12, 14, 16 bordering the sidewall 27 of the trench 28, may be composed of a high-k dielectric material, such as hafnium oxide, that is conformally deposited with a uniform thickness by atomic layer deposition.

The dielectric layer 30 and metal layer 32 replicate the pattern of the trench 28 and deposit inside the trench 28 without fully filling the trench 28. The dielectric layer 30 and the metal layer 32 are continuous over the entire sidewall 27 of the trench 28 and, following their deposition, surround an open space inside the trench 28. The metal layer 32 has a thickness, t1, the dielectric layer 30 has a thickness, t2, and the width, w, of the trench 28 (FIG. 4) is greater than twice the sum of the thickness, t1, of the metal layer 32 and the thickness, t2, of the dielectric layer 30.

In an alternative embodiment, the dielectric layer 30 may be omitted such that the metal layer 32 directly contacts the surfaces of the dielectric layers 12, 14, 16 bordering the trench 28. In this instance, the metal layer 32 only partially fills the trench 28, and the width, w, of the trench 28 (FIG. 4) is greater than twice the thickness, t1, of the metal layer 32.

Figure 6:
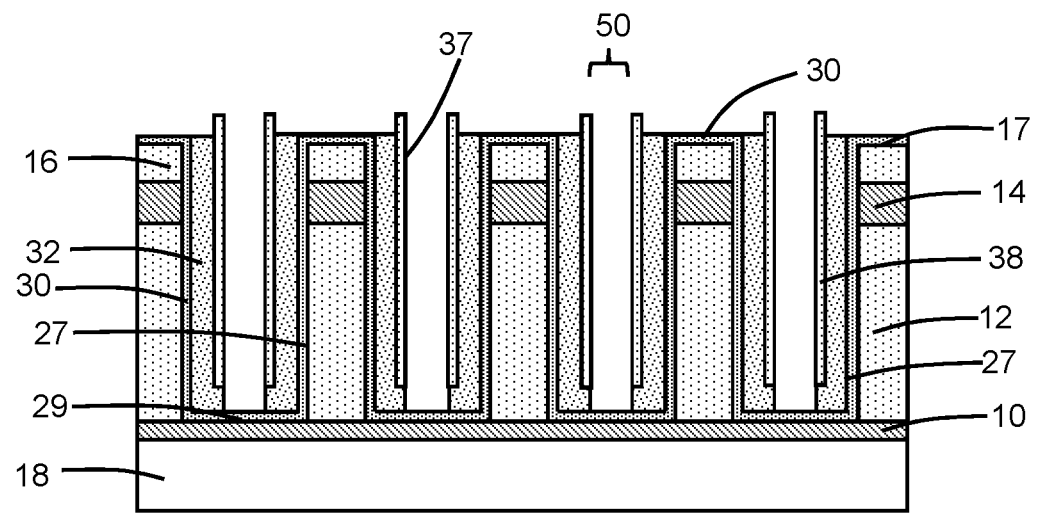

With reference to FIG. 6 in which like reference numerals refer to like features in FIG. 5 and at a subsequent fabrication stage, a spacer 38 may be formed inside the trench 28 on the metal layer 32. The spacer 38 may be composed of a dielectric material, such as silicon dioxide, that is conformally deposited and etched with an anisotropic etching process, such as reactive ion etching. In an alternative embodiment, the spacer 38 may be omitted. The spacer 38 is arranged over a portion of the metal layer 32 at the bottom 29 of the trench 28, and the spacer 38 has a surface 37 that is oriented in a vertical direction parallel to the sidewall 27 of the trench 28.

A portion of the metal layer 32 exposed interior of the spacer 38 is removed from the bottom 29 of the trench 28 using an etching process, such as a reactive ion etching process. The spacer 38 provides an etch mask for the etching process inside the trench 28. The removal of the portion of the metal layer 32 at the bottom 29 of the trench 28, which exposes a portion of the dielectric layer 30, may operate to increase the electrical resistance of a resistor formed using the metal layer 32 because the metal layer 32 remains only on the sidewall 27 of the trench 28. The removal of the metal layer 32 at the bottom 29 of the trench 28 introduces a discontinuity 50 such that lower portions of the metal layer 32 are disconnected. The spacer 38 defines a boundary for the discontinuity 50 that winds along the length of the trench 28. In an embodiment, the discontinuity 50 winds along an entire length of the trench 28 and includes changes in direction established by the changes in direction of the trench 28.

The etching process may also remove the metal layer 32 from over the dielectric layers 12, 14, 16 such that portions of the dielectric layer 30 on the dielectric layer 16 are exposed. The removal of the metal layer 32 effectively disconnects the metal layer 32 above the sidewall 27 of the trench 28 and, therefore, disconnects the metal layer 32 over the dielectric layers 12, 14, 16.

Figure 7:
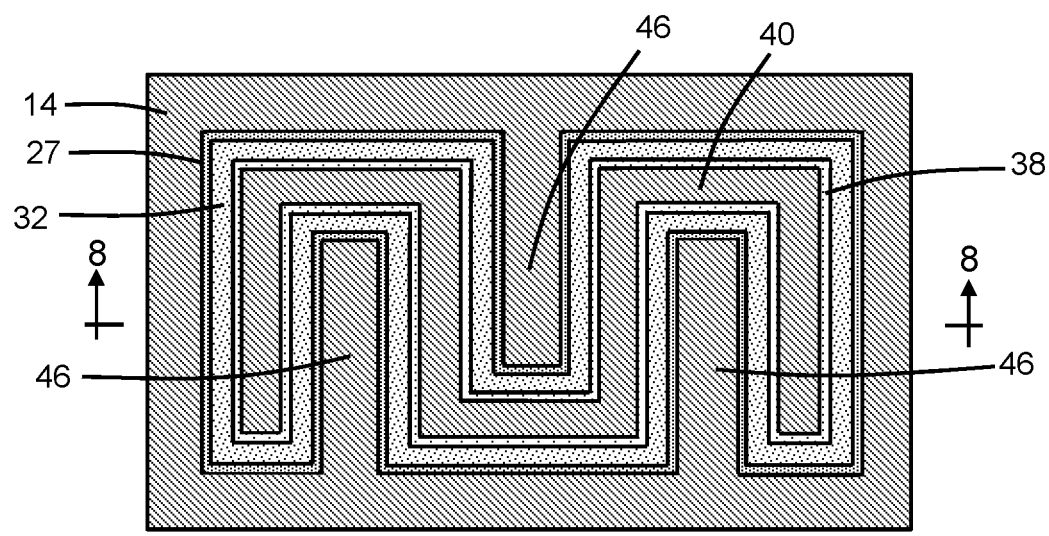
FIG. 7 is a top view of the structure at a fabrication stage subsequent to FIG. 6.
Figure 8:
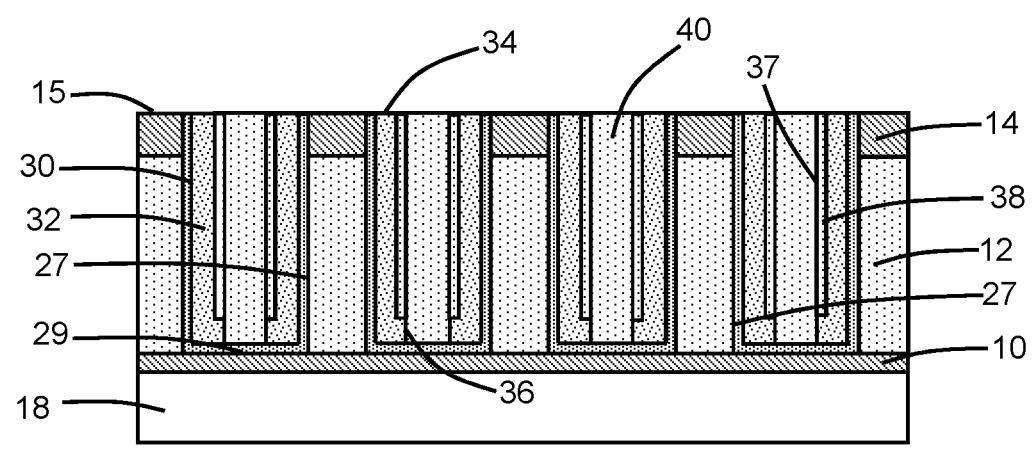
FIG. 8 is a cross-sectional view taken generally along line 8-8 in FIG. 7.

With reference to FIGS. 7, 8 in which like reference numerals refer to like features in FIG. 6 and at a subsequent fabrication stage, a dielectric layer 40 is formed that fills the remaining empty space inside the trench 28 that is not occupied by the metal layer 32, the dielectric layer 30, and the spacer 38. The dielectric layer 40 may be composed of a dielectric material, such as silicon dioxide, that is deposited and planarized with chemical mechanical polishing. The metal layer 32 and dielectric layer 40 are also planarized, and the dielectric layer 16 is removed from the dielectric layer 14 with chemical mechanical polishing. The dielectric layer 14, which may function as a polish stop, is exposed by the removal of the dielectric layer 16.

The metal layer 32 is fully arranged at and below a top surface 15 of the dielectric layer 14 (i.e., the top of the trench 28). The metal layer 32 is fully arranged at and above the bottom 29 of the trench 28. The metal layer 32, which is oriented in a vertical direction, terminates at the top surface 15 of the dielectric layer 14 and terminates at or near the bottom surface of the dielectric layer 12 that is conterminous with the bottom 29 of the trench 28. More specifically, the metal layer 32 is terminated by a surface 34 that extends about the winding perimeter of the trench 28 at the top of the trench 28, and the metal layer 32 is terminated by a surface 36 that extends about the winding perimeter of the trench 28 at the bottom 29 of the trench 28. The upper portions of the metal layer 32 are not connected to each other due to the terminating surface 34 at the top of the trench 28, and the lower portions of the metal layer 32 are not connected to each other due to the terminating surface 36 at the bottom of the trench 28. The surface 37 of the spacer 38 is coplanar with the surface 36 of the metal layer 32.

The metal layer 32 bends and turns to provide changes in direction in association with the sections 42, 44 (FIG. 3) of the trench 28, and winds back and forth with a meandering or serpentine pattern in a manner established by the trench 28 in the dielectric layers 12, 14. The metal layer 32 defines a resistor body that coats only the sidewall 27 of the trench 28 to provide a three-dimensional shape. The resistor body provided by the metal layer 32 may operate to reduce resistor size without an impact on resistor performance. For example, a resistor body of equivalent resistance can be formed in a smaller amount of space that would be occupied by a conventional planar resistor.

Figure 9:
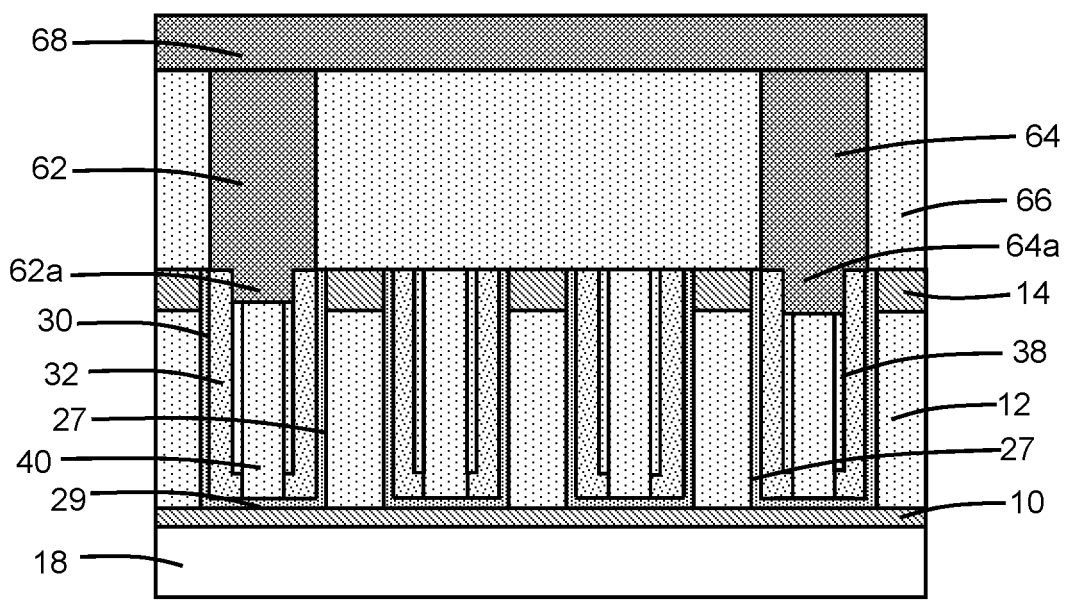
FIG. 9 is a cross-sectional view of the structure at a fabrication stage subsequent to FIG. 8.

With reference to FIG. 9 in which like reference numerals refer to like features in FIG. 8 and at a subsequent fabrication stage, contacts 62, 64 are formed in an interlayer dielectric layer 66 and a metal line 68 is formed that is coupled by the contacts 62, 64 with different portions of the resistor body defined by the metal layer 32. The spacer 38 and dielectric layer 40 may be recessed relative to the metal layer 32 to define an unfilled space when the contact openings for the contacts 62, 64 are formed in the interlayer dielectric layer 66. As a result, the contacts 62, 64 each have a side contact with the metal layer 32 in addition to a top contact with the metal layer 32. In that regard, a respective lower portion 62a, 64a of each of the contacts 62, 64 directly contact the metal layer 32 at the sidewall 27 of the trench 28. The recessed spacer 38 and dielectric layer 40 are located between the bottom 29 of the trench 28 and each of the contacts 62, 64. The contact 62 is spaced along the length of the metal layer 32 from the contact 64. The contacts 62, 64 provide the terminals for the resistor body defined by the metal layer 32. In use, current flows through the metal layer 32 from one of the contacts 62, 64 to the other of the contacts 62, 64 with a voltage drop occurring across the resistor body.

The metal layer 32 providing the resistor body is located fully at and below the top surface of the dielectric layer 14 and is located fully below the interlayer dielectric layer 66. This location for the metal layer 32, which is below the horizontal interface between the dielectric layer 14 and the interlayer dielectric layer 66 and which is also between the substrate 18 and the interlayer dielectric layer 66, contrasts with conventional resistor bodies that are formed over the dielectric layer 14 and that are covered by the interlayer dielectric layer 66.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a resistor, the structure comprising:
   a first dielectric layer including a trench having a bottom, a sidewall arranged to surround the bottom, and a length;
   a second dielectric layer positioned over the bottom of the trench;
   a metal layer on the first dielectric layer at the sidewall of the trench, the metal layer including a first surface that terminates the metal layer at the bottom of the trench to define a first discontinuity that extends along the length of the trench, the second dielectric layer recessed relative to the metal layer to define a space, and the metal layer surrounding the second dielectric layer; and
   a contact having a portion extending into the space, the portion of the contact directly coupled to the metal layer along a portion of the sidewall of the trench.

2. The structure of claim 1 wherein the first dielectric layer has a top surface, the metal layer including a second surface that terminates at the top surface of the first dielectric layer to define a second discontinuity that extends along the length of the trench, and the metal layer is fully arranged at and below the top surface of the first dielectric layer.

3. The structure of claim 1 wherein the metal layer has a thickness, and the trench has a width that is greater than twice the thickness of the metal layer.

4. The structure of claim 1 wherein the second dielectric layer extends from the bottom of the trench to the contact.

5. The structure of claim 4 wherein the first surface of the metal layer is located below the second dielectric layer.

6. The structure of claim 1 wherein the trench includes a plurality of changes in direction along the length of the trench to define a serpentine pattern.

7. The structure of claim 1 further comprising:
   a third dielectric layer positioned between the metal layer and the sidewall of the trench, the third dielectric layer comprised of a high-k dielectric material.

8. The structure of claim 1 further comprising:
   a dielectric spacer positioned in the trench between the second dielectric layer and the metal layer.

9. A structure for a resistor, the structure comprising:
   a first dielectric layer including a trench having a bottom, a sidewall arranged to surround the bottom, and a length;
   a second dielectric layer positioned over the bottom of the trench;
   a metal layer on the first dielectric layer at the sidewall of the trench, the metal layer including a first surface that terminates the metal layer at the bottom of the trench to define a first discontinuity that extends along the length of the trench, and the metal layer surrounding the second dielectric layer; and a dielectric spacer positioned in the trench between the second dielectric layer and the metal layer.

10. The structure of claim 9 wherein the dielectric spacer has a surface that is coplanar with the first surface of the metal layer.

11. The structure of claim 9 wherein the first dielectric layer has a top surface, the metal layer including a second surface that terminates at the top surface of the first dielectric layer to define a second discontinuity that extends along the length of the trench, and the metal layer is fully arranged at and below the top surface of the first dielectric layer.

12. The structure of claim 9 wherein the trench includes a plurality of changes in direction along the length of the trench to define a serpentine pattern.

13. The structure of claim 9 further comprising:
a third dielectric layer positioned between the metal layer and the sidewall of the trench.

14. The structure of claim 13 wherein the third dielectric layer is comprised of a high-k dielectric material.

15. A structure for a resistor, the structure comprising:
a first dielectric layer including a trench having a bottom, a sidewall arranged to surround the bottom, and a length;
a metal layer on the first dielectric layer at the sidewall of the trench, the metal layer including a first surface that terminates the metal layer at the bottom of the trench to define a first discontinuity that extends along the length of the trench; and
a second dielectric layer positioned between the metal layer and the sidewall of the trench,
wherein the second dielectric layer is conformal with a uniform thickness, and the metal layer is conformal with a uniform thickness.

16. The structure of claim 15 wherein the second dielectric layer is comprised of a high-k dielectric material.

17. The structure of claim 15 wherein the trench has a width that is greater than twice a sum of the uniform thickness of the metal layer and the uniform thickness of the second dielectric layer.

18. The structure of claim 15 further comprising:
a third dielectric layer arranged over the first dielectric layer;
a first contact in the third dielectric layer, the first contact coupled to a first portion of the metal layer; and
a second contact in the third dielectric layer, the second contact coupled to a second portion of the metal layer, and the second contact spaced along the length of the trench from the first contact,
wherein the metal layer is arranged fully below an interface between the first dielectric layer and the third dielectric layer.

19. The structure of claim 15 wherein the first dielectric layer has a top surface, the metal layer including a second surface that terminates at the top surface of the first dielectric layer to define a second discontinuity that extends along the length of the trench, and the metal layer is fully arranged at and below the top surface of the first dielectric layer.

20. The structure of claim 15 wherein the trench includes a plurality of changes in direction along the length of the trench to define a serpentine pattern.

* * * * *